United States Patent [19]

Nishimoto

[11] Patent Number: 4,500,797

[45] Date of Patent: Feb. 19, 1985

[54] ALTERNATING POLARITY POWER SUPPLY CONTROL APPARATUS

[75] Inventor: Ikuo Nishimoto, Hennepin County, Minn.

[73] Assignee: Honeywell Inc., Minneapolis, Minn.

[21] Appl. No.: 33,585

[22] Filed: Apr. 26, 1979

[51] Int. Cl.³ .............................................. H03K 3/01
[52] U.S. Cl. ............................ 307/296 R; 307/296 A; 307/570; 307/571
[58] Field of Search ................ 307/296 A, 251, 296 R

[56] References Cited

U.S. PATENT DOCUMENTS

Re. 26,119 12/1966 Slater .................................... 307/296
3,281,638 10/1966 Crawford ............................ 307/296

Primary Examiner—Harold Dixon
Attorney, Agent, or Firm—Theodore F. Neils; William T. Udseth

[57] ABSTRACT

An electronic switching circuit is provided for controlling transfer of electrical power from an alternating polarity electrical power supply to a load means through use of a field-effect transistor device as a primary power controlling element. The circuit also is arranged such that the alternating polarity electrical power supply provides power for operating further circuit components used to direct operation of the primary power controlling element. Certain of these further circuit elements can be prevented from drawing electrical power in certain situations.

57 Claims, 1 Drawing Figure

ALTERNATING POLARITY POWER SUPPLY CONTROL APPARATUS

Reference is made to earlier filed copending applications, all assigned to the same assignee, by T. E. Hendrickson entitled "Alternating Polarity Power Supply Control Apparatus" having Ser. No. 973,215; and now U.S. Pat. No. 4,256,977 by T. E. Hendrickson, et al., entitled "Alternating Polarity Power Supply Control Apparatus" having Ser. No. 973,463; and now U.S. Pat. No. 4,256,979 and by T. E. Hendrickson, et al., entitled "Semiconductor Apparatus" having Ser. No. 24,840.

BACKGROUND OF THE INVENTION

The present invention is related to circuits in which a field-effect transistor device controls power transfer from an alternating polarity electrical power supply to a load means, particularly when such field-effect of transistor devices are capable of being integrated in monolithic integrated circuits.

The copending applications above entitled "Alternating Polarity Power Supply Control Apparatus" disclose several versions of circuits for controlling power transfer from an alternating polarity electrical power supply to a load means where the circuit components for directing operation of the primary power transfer control element are also supplied electrical power from the alternating polarity power supply. In some of these versions, the switching on of the primary power transfer controlling element, a field-effect transistor device, as a result of a command to do so eliminates or permits reducing the supply of electrical power to the circuit components used for controlling this primary power transfer control transistor device. An energy storage device is provided in certain of these versions which continues to supply power for the circuit components directing the primary power transfer control device even when this device is switched on. Sooner or later, however, this energy storage means will discharge to the point where there is no longer sufficient electrical power stored therein to operate the circuit components directing the primary power transfer control device.

At such a time, the circuit components directing operation of the primary power transfer controlling device can no longer keep this device switched on. When this device switches off, the energy storage means is again charged and the electrical components for directing operation of the primary power transfer controlling device are again operative so that this device thereafter again switches on assuming the command to do so remains.

A desirable feature for such a circuit would be the inclusion of a means to reduce the drain on the energy storage means by the circuit components directing the primary power transfer control device during times when this device is switched on. This would accomplish keeping the device switched on for a longer period of time before insufficient electrical power to the circuit components controlling this device causes the device to be switched off for a storage means recharge.

SUMMARY OF THE INVENTION

The invention provides a circuit with a field-effect-transistor device, to be used in controlling power transfers between an alternating polarity power supply and a load, where this supply and the load, in operation, would be connected on either side of the device channel. The circuit has effectively a unidirectional current conducting means electrically connected from either side of the field-effect transistor device channel selectively to the gate region of that device, the selection being the making of the connection through either an energy storage means or directly, with this selection being made by a selectively operated switching means. The energy storage means can be such as to obtain its energy from the alternating polarity power supply. In one form, there are electrical circuit components connected in parallel with the energy storage means, which are primarily used for directing operation of the field-effect transistor device, but which also include a power conservation means for switching some of these electrical components in a manner so thereafter they are not directly across the energy storage means when the field-effect transistor device has been switched on.

DESCRIPTION OF THE PREFERRED EMBODIMENTS

Figure 1:
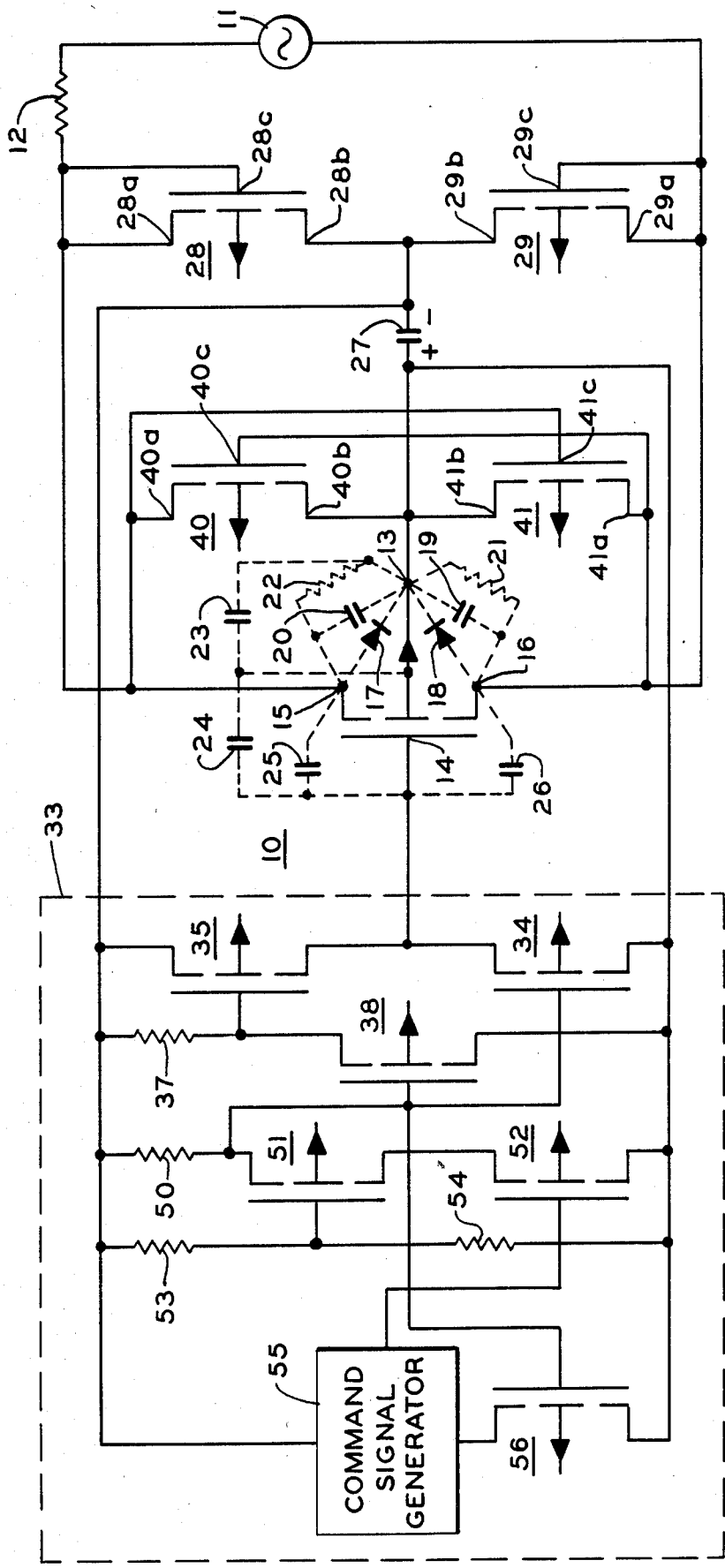
FIG. 1 shows an embodiment of the circuit of the present invention.

FIG. 1 shows a circuit for controlling power transfers from an alternating polarity electrical power supply, 11, to a load means, 12, using a field-effect transistor device, 10, as the primary power transfer control element. Device 10 is shown as, effectively, an enhancement mode, p-channel, metal-oxide-silicon field-effect transistor (MOSFET). The application referenced above entitled "Semiconductor Apparatus" teaches various devices, effectively field-effect transistors, which would be suitable for use as transistor 10.

Substantial portions of the circuits shown in FIG. 1 are also described in the applications referenced above entitled "Alternating Polarity Power Supply Control Apparatus". That is, the circuit components of circuit structure outside of the dashed-line block, 33, have been described in these referenced applications. This is also true of the three transistors and resistive loads shown on the right hand side of the circuitry contained in block 33 which are designated 34, 35 and 38 for the transistors and 37 for the resistive load. However, the circuit operation will be described below to a limited extent for the entire circuit shown in FIG. 1. Details of the operation of the circuit components described in the referenced applications can be found there.

In the circuit portion outside of block 33 is field-effect transistor device 10 having terminating regions, 15 and 16, which serve as source and drain for transistor 10. These regions are connected to load means 12 and supply 11, these two circuit components being connected together in series. Transistor 10 has about it numerous effective, but parasitic, circuit components shown in FIG. 1 which are inherent in device 10 because of the construction of that device. All of these parasitic components are presented in equivalent "lumped" form in FIG. 1. Of course, every transistor physical structure leads to having, effectively, parasitic components associated therewith. However, such parasitic components are more likely to be significant in value for a power transfer control transistor device, such as transistor 10, as compared to a transistor for controlling only information signals because the power transistor is usually of a relatively large physical size when compared to transistors used for controlling signals only. Thus, the parasitic components are explicitly shown for only transistor 10 in FIG. 1 even though such parasitic components are also associated with the structures of the other transistors shown in FIG. 1. The assumption is that these other transistors have associated parasitics that will have a relatively insignificant effect on circuit operation.

Field-effect transistor 10, being a p-channel MOSFET, is provided in a substrate of semiconductor material of n-type conductivity. FIG. 1 shows the substrate and its electrical connection points to be designated 13. The terminating regions 15 and 16 which terminate the ends of the substrate channel region in transistor 10, and serve as source and drain regions therein, are formed by diffusion or implantation of p-type conductivity impurities into the substrate material. Parasitic diodes are formed in the structure of transistor 10 by the semiconductor pn junctions occurring between regions 15 and 16, on the one hand, and the substrate of transistor 10 on the other. These diodes are designated 17 and 18 in FIG. 1. A gate, 14, is provided adjacent the channel region in transistor device 10 separated from this region by an insulating layer.

Also associated with these pn junctions are parasitic capacitances, 19 and 20, and parasitic resistances, 21 and 22. Further parasitic capacitances present are a channel-to-substrate capacitance, 23, and a gate-to-channel capacitance, 24. Two other parasitic capacitances, 25 and 26, are shown which are each effective between gate 14 and one of the channel terminating regions 15 or 16. All of these parasitic components will have more or less of an effect on the operating behavior of transistor device 10, and so in the behavior of the circuit in which transistor device 10 is provided. The significance of these effects depends on the conditions existing in such a circuit.

Of course, capacitance 24 is essential for switching on transistor device 10 by forming a channel, yet this capacitance and the other parasitic components shown around transistor device 10 are normally desired to contribute as insignificantly as possible to the circuit operation. At sufficiently low frequencies, the parasitic capacitances shown in connection with transistor device 10 in FIG. 1 will not be significant factors in the operation of the circuit of this figure. Also, the leakage resistances 21 and 22 of FIG. 1 are usually sufficiently large so that they will not be significant in the operation of this circuit. Further, note that load means 12 could also have a reactive component thereto but has been shown, and will be described, as being resistive for ease of understanding and exposition.

However, for sufficiently high frequencies of polarity alternation in the output voltage of alternating polarity power supply means 11, the parasitic capacitances about transistor device 10 will have an effect in the operation of the circuit if provisions are not made to prevent such effects.

At least three detrimental circuit operation effects, of possible significance, can occur because of the presence of these parasitic capacitances. First, the charging of parasitic capacitances 19 and 20, and capacitance 27, with transistor device 10 off can lead to bipolar transistor action between terminating regions 15 and 16. This occurs in the form of an effective pnp transistor which would tend to provide a more or less conductive pathway between terminating regions 15 and 16, regions which otherwise are intended to be electrically isolated from one another in these circumstances. Second, the charge on these parasitic capacitances may lead to delays in the intended operation of transistor device 10 because of this charge on these parasitic capacitances tending to maintain earlier existing conditions about transistor device 10 until these parasitic capacitances have been discharged. This can lead to transistor device 10 responding slowly, incompletely, or not at all to the electrical signals supplied intended to control this transistor.

Finally, the charging of the parasitic capacitances leads to a voltage thereacross which can add to the voltage being provided by alternating power supply 11 as it changes polarity. This situation can either cause transistor device 10 to break down or would require the breakdown voltages associated with transistor device 10 to be approximately twice as large as the peak voltage being supplied by alternating polarity power supply 11.

Thus, parasitic diodes 17 and 18 are shown bypassed by a pair of transistors, 40 and 41, in FIG. 1 and these diodes are not being relied on in the circuit of FIG. 1 to aid in the charging of the energy storage means, 27, shown as a capacitor there. With diodes 17 and 18 being bypassed, the capacitances in parallel therewith are also bypassed to prevent them from affecting circuit operation. Of course, for sufficiently low frequencies of polarity alternation in the voltage output of supply 11, diodes 17 and 18 could be relied upon as part of the rectifying apparatus for charging capacitance 27 so that transistors 40 and 41 would not be needed in this rectifying apparatus. At such low frequencies, capacitances 19 and 20 will have such high impedances that they will not significantly affect circuit operation as indicated above.

Note that a separate power supply means could be used in place of capacitance 27, and this would be done to use a depletion mode device in place of enhancement mode transistor device 10. However, an advantage of the circuit shown in FIG. 1 herein is that the circuitry for controlling power transfers through transistor device 10 from supply 11 to load means 12 can be operated from electrical power supplied solely by alternating power supply 11. That is, the control switching means or directing means shown in block 33, directing operation of the primary power transfer controlling component, transistor device 10, can be operated solely from voltage developed across capacitor 27 which is ultimately derived from supply 11.

In any event, transistors 40 and 41 are provided to selectively shunt parasitic resistances 17 and 18. Transistor 40 is an enhancement mode, p-channel MOSFET having one of its terminating regions connected to substrate connection 13 of transistor device 10 and the other connected to terminating region 15 of transistor device 10. Transistor 41 is also an enhancement mode, p-channel MOSFET having one of its terminating regions again connected to substrate connection 13 and the other connected to terminating region 16 of transistor device 10. The gate region of transistor 40 is connected to terminating region 16 of transistor device 10 and, similarly, the gate region of transistor 41 is connected to terminating region 15 of transistor device 10. Other kinds of bypass means can be used in place of transistors 40 and 41 as is shown in the applications referenced above entitled "Alternating Polarity Power Supply Control Apparatus".

Two further enhancement mode, p-channel MOSFET's, 28 and 29, are connected across alternating polarity power supply 11 and load means 12, and further, they are connected to each operate as a diode. In operating in this manner, transistor 28 appears to be a diode having its cathode connected to a circuit portion including alternating polarity power supply 11 and load means 12 and its anode connected to energy storage capacitor 27. The same description fits transistor 29. Of course, an ordinary diode structure could be used in place of either or both of transistors 28 and 29 and one or the other of these diodes need not be present as indicated in the just mentioned applications referenced above. The side of capacitor 27 not connected to transistors 28 and 29 is connected to substrate connection 13 of transistor device 10.

As indicated above, the sole source of power used to operate the circuit of FIG. 1 is shown to be alternating polarity power supply 11. Supply 11 not only provides power for transfer to load means 12, upon being selected to do so by appropriately activating switching circuitry in dashed-line block 33, but also provides power to be stored in capacitor 27 to operate switching control circuitry in block 33 and perhaps other circuits also. Such other circuits might also be present in a monolithic integrated circuit chip in which the circuitry of FIG. 1 could be implemented. In operation, the switching circuitry in dashed-line block 33 has a pair of transistors 34 and 35, which together form a single pole, double throw switch, with one of these transistors being switched off while the other one is switched on. Transistors 34 and 35, which are enhancement mode, p-channel MOSFET's, are connected in series with one another, drain to source, respectively, and this series combination is connected across capacitor 27. The juncture of transistors 34 and 35 in this series combination is electrically connected to gate 14 of primary power transfer control transistor device 10.

Output signals from a NAND logic gate (using a negative logic convention with the positive side of capacitor 27 as the voltage reference level) determines which of transistors 34 and 35 is on and which is off. This NAND logic gate is comprised of two enhancement mode, p-channel MOSFET's, 51 and 52, connected in series by connecting the drain of transistor 52 to the source of transistor 51, and these are further connected in series with a load resistance, 50, connected to the drain of transistor 51. The other end of load resistance 50 is connected to capacitor 27 while the source of transistor 52 is connected to the opposite side of capacitor 27. The output of this NAND logic gate circuit is taken from the drain of transistor 51 and is connected to the gate of transistor 34 directly. The same output is connected through an inverter to the gate of transistor 35. The inverter comprises an enhancement mode, p-channel MOSFET, 38, connected in series with a load resistance, 37. Again, the other end of load resistance 37 is connected to capacitor 27, while the source of transistor 38 is connected to the other side of capacitor 27.

The gates of transistors 51 and 52 form the inputs for the NAND logic gate of which these transistors are a part. The gate of transistor 51 is connected to the juncture of pair resistances, 53 and 54, serving as a voltage divider. Resistances 53 and 54, in view of the behavior of transistor 51 above and below its threshold voltage, together form a voltage detector indicating whether the voltage at the juncture of resistances 53 and 54 is of a sufficient value to switch on transistor 51. As the series connection of resistances 53 and 54 is across capacitor 27, the effect is to determine the sufficiency of voltage appearing on capacitor 27 to keep transistor 51 switched on through resistors 53 and 54.

The other input to the NAND logic gate occurs at the gate of transistor 52 which is connected to a command signal generator, 55. Command or control signal generator 55 provides an output signal in response to a circuit user's commands and this output signal is assumed here to be a two state logic signal with each state represented by a different voltage value. In one state, the output signal from generator 55 would be of a sufficient value to switch on transistor 52 while in the other state this output signal would be of an insufficient value to switch on transistor 52. Command signal generator 55 may receive the user's commands by way of some external switching action or by sensing some other external condition. On the other hand, the generator may have a built-in sensor to provide command signals.

Command signal generator 55 is shown in series connection with another enhancement mode, p-channel MOSFET, 56, with generator 55 connected to the drain of transistor 56. This series combination is again across capacitor 27. The gate of transistor 56 is connected to the output of the NAND logic gate, i.e., the drain of transistor 51. Thus, one of the states of the output signal of the NAND logic gate will be such as to switch transistor 56 off preventing current from flowing through command signal generator 55 by virtue of electrically disconnecting it from one side of capacitor 27.

In describing the operation of the circuit of FIG. 1, the circuit is assumed to have no electrical energy stored therein at the time voltage is first provided by supply 11 to the remainder of the circuit. Further, conditions inside the command signal generator 55 are assumed to be such that, if energized, the output signal of generator 55 would be in one of the two assumed possible logic states that has a voltage value closest to that appearing on the side of capacitor 27 connected to transistors 40 and 41.

With no voltage appearing on capacitor 27, there is no voltage across resistors 53 and 54 nor across the NAND logic gate comprising resistor 50 and transistors 51 and 52. There would be no voltage across the inverter comprising transistor 38 and resistance 37 nor across the single pole, double-throw switch comprising transistors 34 and 35. As a result, gate region 14 will be effectively connected to its substrate 13 as voltage is initially supplied to the circuit by supply 11, and device theory indicates that transistor device 10 will be initially in the off condition.

As voltage is initially supplied by supply 11, capacitor 27 will begin to charge with the polarity shown in FIG. 1. When supply 11 is positive on the side connected to load means 12, a current will flow through load means 12, transistor 40, capacitor 27, and transistor 29. In the opposite polarity condition of supply 11, a current will flow through transistor 41, capacitor 27, transistor 28 and load means 12. Either of these current paths will be of quite high conductivity since device theory indicates the transistors just indicated in these paths will be switched fully on and load means 12 is assumed to be a relatively low impedance since it is expected to dissipate a substantial amount of power. Thus, capacitor 27 is likely to be fully charged at the voltage extrenum in a single half cycle of power supply 11, at least if transistor device 10 remains switched off and capacitor 27 is not of too large a value.

In any event, as the voltage begins to increase on capacitor 27, there will similarly be an increasing voltage applied across the control circuitry contained in dashed-line block 33. Initially, the voltage occurring across the voltage divider comprising resistances 53 and 54 will be such that the voltage at the junction of the resistances will be insufficient to cause transistor 51 to switch on. As a result, transistor 51 is off and the voltage at the drain of transistor 51, the output of NAND logic gate, will be relatively negative in being close to the value occurring on the negative side of capacitor 27. Thus, the gates of transistors 34 and 38 will be relatively negative and device theory indicates these transistors will be switched on. Switching on of transistor 38 places the gate of transistor 35 at the voltage approximately that appearing on the positive side of capacitor 27 so that transistor 35 is switched off. Thus, gate 14 of transistor device 10 remains effectively connected to substrate 13 thereof, as it was initially, because of transistor 34 being switched on. The result is that transistor device 10 remains switched off as voltage increases across capacitor 27. Thus, this voltage will continue to increase on capacitor 27 with increases in the value of the voltage supplied by supply 11 without interference due to any change in the operational state of transistor device 10.

Further note, that with the voltage at the drain of transistor 51 relatively negative, that transistor 56 will be switched on so that command signal generator 55 is across capacitor 27 and is receiving power from supply 11. However, the output from command signal generator has been assumed initially to be such that it is near the positive side of capacitor 27 thereby holding transistor 52 switched off.

At some point in the half cycle of supply 11, the voltage across capacitor 27 increases sufficiently so that the voltage at the juncture of resistances 53 and 54 exceeds the threshold voltage of transistor 51. Thus, device theory indicates that the voltage at the gate of transistor 51 would be sufficient to turn that transistor on. The assumption that command signal generator 55 has as voltage nearly equal that on the positive side of capacitor 27 means that transistor 52 continues to be off so that the NAND logic function is not satisfied. The NAND logic gate output therefore does not change state. Hence, although the voltage at the gate of transistor 51 now exceeds the threshold voltage of that transistor, this situation does not change conditions in the remainder of the circuit.

As a result, capacitor 27 can charge fully in a single half cycle assuming that the impedance of load means 12 is sufficiently small. If there is no change in the output signals from command signal generator 55, the circuit of FIG. 1 continues on in subsequent half cycles of supply 11 just as described with one exception. The exception is that upon fully charging capacitor 27 no further significant current will flow through load means 12. The only current to be supplied will be that to make up any discharge losses of capacitor 27 by virtue of the drain caused by resistors 53 and 54, the inverter involving transistor 38 and resistor 37, and the command signal generator 55. These are likely to be relatively high impedance and so relatively little current will flow through load means 12. Load means 12 is assumed to be of such a nature that a small current through it will cause no adverse effect.

Assume now that the user of the circuit, or a sensor, causes the state of the output signal of command signal generator 55 to change to that state having a value relatively near that of the voltage appearing on the negative side of capacitor 27. Device theory indicates that the immediate result is to switch on transistor 52 so that both transistors 51 and 52 are now switched on. This situation satisfies the logic of the NAND logic gate so that the output at the drain of transistor 51 increases in voltage to be nearly equal to that occurring on the positive side of capacitor 27. This causes the gates of transistors 34, 38 and 56 to be brought near the voltage value of the positive side of capacitor 27, a situation in which device theory indicates that these transistors will be switched off.

Switching off transistor 34 and switching on transistor 35 (through switching off transistor 38) connects gate region 14 of transistor device 10 to the negative side of capacitor 27 thereby introducing between substrate connection 13 and gate 14 the voltage appearing on capacitor 27. Device theory indicates that transistor device 10 then switches on leading to a transfer of significant power from supply 11 to load means 12.

Switching off transistor 56 breaks the current path between the side of capacitor 27 connected to substrate 13 and command signal generator 55. This prevents current flow from capacitor 27 through command signal generator 55. Further, command signal generator 55 will, generally, sooner or later take on the voltage value occurring on the negative side of capacitor 27 so that the output signal connection from generator 55 continues to be a voltage having a value approximately that of the negative side of capacitor 27 thus tending to keep transistor 52 switched on. Since this is the initial event which led to the switching on of transistor device 10, the condition of the circuit in FIG. 1 just described seems to be stable.

However, switching on of transistor device 10 prevents supply 11 from charging capacitor 27 because the voltage between terminating regions 15 and 16 of transistor device 10 goes to nearly zero with all of the voltage drop occurring across load means 12 so little or nothing is left to be dropped across capacitor 27. As a result, voltage is maintained across the circuitry in the dashed-line block 33 only to the extent that voltage remains on capacitor 27.

The circuitry in dashed-line block 33 acts to discharge the voltage stored on capacitor 27 with the result that the voltage across capacitor 27 is continually decreasing. This is the basis for use of transistor 56 in the block 33 circuitry in such a manner that it is switched off during those times that transistor device 10 is switched on, times during which any charging of capacitor 27 by supply 11 is prevented. This switching of transistor 56 off during such times eliminates the drain on capacitor 27 due to the circuits in the command signal generator 55. Such circuits in many instances will add up to a substantial current drain which acts to discharge capacitor 27. By choosing the resistors appearing in dashed-line block 33 to have very high resistance values and by using transistor 56 to eliminate the current drain through command signal generator 55, the drain due to the circuitry in dashed-line block 33 on the stored charge capacitor 27 can be made relatively small.

However, despite these measures, the time will come when the voltage on capacitor 27 has finally decreased to the point where the voltage at the junction of the voltage divider comprising resistors 53 and 54 is below the threshold voltage of transistor 51. At that time, device theory indicates that transistor 51 will switch off so that the voltage at the drain of transistor 51, i.e., the output at the NAND logic gate, becomes nearly equal to that on the negative side of capacitor 27. This results in switching on transistors 34 and 38 while switching off transistor 35 and transistor device 10.

Switching off transistor device 10 leads to recharging capacitor 27 in typically the next half cycle of supply 11 as described above for the usual choice of values for load 12 and capacitor 27. Note that the switching off of transistor 51 also leads to switching on transistor 56 thereby reconnecting command signal generator 55 to the positive side of capacitor 27.

As this recharging of capacitor 27 goes along, the voltage thereacross will reach a point such that the voltage across the voltage divider comprising resistors 53 and 54 leads to the voltage occurring at the junction of these resistors being greater than the threshold voltage of transistor 51. If the output signal of command signal generator 55 remains in a state having a voltage value near the value on the negative side of capacitor 27, transistor 52 will be switched on along with transistor 51. This situation again satisfies the logic requirement of the NAND logic gate and again leads to switching on transistor device 10. Thus, the occurrence in command signal generator 55 of a condition leading to commanding transistor device 10 to be switched on actually leads to a cycling situation in which transistor device 10 is switched on most of the time but is switched off for a fraction of a cycle of supply 11 to permit recharging of capacitor 27. Hence, the use of transistor 56 increases the duration of that portion of the cycle in which transistor device 10 is switched on to thereby increase the proportion of time in a given period in which power is being transferred to the load means 12. For many kinds of loads, which could serve as load means 12 in the circuit of FIG. 1 there is no adverse reaction to losing a half cycle of voltage application thereto during times when such a load is intended to receive power transfer from supply 11.

On the other hand, there may have occurred in command signal generator 55 a condition which leads to the output signal thereof being in a state which has a voltage value relatively close to that on the positive side of capacitor 27. Then, device theory indicates that transistor 52 will be switched off. In these circumstances, even though the charging of capacitor 27 goes to the point permitting transistor 51 to switch on through the voltage divider action of resistances 53 and 54, the logic requirements for the NAND logic gate will not be satisfied because transistor 52 has switched off. This result leads to transistor device 10 remaining switched off. Thus, command signal generator 55 is effectively checked regularly and permitted to provide the signals for controlling transfers of power from supply 11 to load means 12 through this generator causing transistor device 10 to switch on and off even though generator 55 is prevented from drawing current therethrough by transistor 56 during times transistor device 10 is switched on.

Some typical resistance values for the resistances appearing in the dashed line block 33 might be 5 megohms for resistances 37 and 50, 10 megohms resistance 53 and 2.2 megohms for resistance 54. Typically, capacitance 27 will be a capacitance fabricated in a monolithic integrated circuit and so will have a relatively low value. Hence, the impedances for these resistances just given are in the range of millions of ohms to provide a satisfactory time constant for the discharge of capacitance 27 during times when transistor device 10 is switched on.

The circuit of FIG. 1 can, in many instances, be entirely provided in a monolithic integrated circuit usually excluding, of course, supply 11 and load means 12. Even the command signal generator 55 can be provided in such a monolithic integrated circuit if it responds to action at distance forces such as changing magnetic fields or changing electromagnetic radiation impingement, or respond to environmental but nonelectromagnetic conditions such as temperature or stress, by there being appropriate sensor fabricated in the monolithic integrated circuit as part of generator 55. In other applications, generator 55 will be connected to an external switching means or other control means. In any event, all of the transistors shown in the circuit of FIG. 1 can be fabricated in a single monolithic integrated circuit chip. In such an instance, all of the substrate connections shown for each of these transistors will be connected together. While all of these transistors are shown as p-channel transistors, they of course could also be n-channel transistors with appropriate voltage polarity reversals.

Also note, that command signal generator 55 could have a reversed set of states from that described above. That is, the signal at the output of generator 55 could alternatively be at the voltage value appearing on the positive side of capacitor 27 at times during which it is desired to have transistor device 10 switched on. To accommodate this condition, transistor 56 is placed on the other side of command signal generator 55 to be able to disconnect this side of transistor 55 from the negative side of capacitor 27.

The pair of voltage divider resistors, 53 and 54, can be replaced by an oscillatory circuit which changes output states periodically. Thus, transistor device 10, when commanded to be switched on by command generator 55, could be periodically switched off for a half cycle or so of supply 11 to periodically charge capacitance 27. Such periodic charging could be used in place of sensing the insufficiency of the voltage on capacitance 27 as the basis for determining the times of recharging of capacitance 27.

Further to be noted with respect to the circuit of FIG. 1 is that it can be operated by a constant polarity voltage source in essentially the same manner as when operated by an alternating polarity supply. This operation can occur without change to the circuit, and without altering its capability to control power transfers from such a source, by directly substituting a constant polarity source for the alternating polarity source shown as supply means 11. The positive side of such a constant polarity voltage source could be connected to either load means 12 or to terminating region 16 of transistor device 10 without essentially altering the circuit function except for the polarity of the voltage drop across load means 12 when transistor device 10 is switched on.

Of course, certain components in the circuit of FIG. 1 can again be eliminated if a constant polarity electrical power supply were to be used as supply means 11. Either or both of transistors 40 and 41 could be removed as could one or the other of transistors 28 and 29. The latter elimination would place a limitation on the polarity choice for the constant polarity power supply used as supply means 11. The remaining one of transistors 28 and 29 could be replaced by a short circuit but need not be.

The embodiments of the invention in which an exclusive property or right is claimed are defined as follows:

1. An electronic switching circuit for controlling transfer of electrical power from an electrical power supply means to a load means, said switching circuit comprising:

a primary control means having first and second terminating regions and having a control region therein by which said primary control means is capable of being directed to effectively provide a conductive path of a selected conductivity between said primary control means first and second terminating regions, said primary control means first terminating region being electrically connected to a first terminal means adapted for electrical connection to a first circuit portion arrangement which includes both said electrical power supply means and said load means, and said primary control means second terminating region being electrically connected to a second terminal means adapted for electrical connection to said first circuit portion arrangement;

a rectifying means having first and second alternating polarity regions and having first and second constant polarity regions such that said rectifying means is capable of providing a constant polarity voltage between said first and second constant polarity regions if supplied with an alternating polarity voltage between said first and second alternating polarity regions, said first alternating polarity region being electrically connected to said first terminal means and said second alternating polarity region being electrically connected to said second terminal means;

an energy storage means having first and second polarity regions between which said energy storage means is capable of providing electrical energy storage, said energy storage means first polarity region being electrically connected to said first rectifying means first constant polarity region and said energy storage means second polarity region being electrically connected to said rectifying means second constant polarity region;

a primary control signal generating means having first and second energization regions and an output region, said primary control signal generating means being capable, upon electrical energization of said primary control signal generating means first and second energization regions, of providing a signal at said primary control signal generating means output region indicating occurrence of one or more selected conditions in said primary control signal generating means, there being one of said primary control signal generating means first and second energization regions electrically connected to one of said rectifying means first and second constant polarity regions;

a control signal coupling means having at least a first input region and a first output region, and which permits, at least selectively, communication to said control signal coupling means first output region concerning signals occurring at said control signal coupling means first input region, said first control signal coupling means first input region being electrically connected to said primary control signal generating means output region and said control signal coupling means output region being electrically connected to said primary control means control region;

a power conservation means having first and second terminating regions and having a control region therein by which said power conservation means is capable of being directed to effectively provide a conductive path of a selected conductivity between said power conservation means first and second terminating regions, said power conservation means first terminating region being electrically connected to that one of said primary control signal generating means first and second energization regions opposite that one connected to one of said rectifying means first and second constant polarity regions as aforesaid, said power conservation means second terminating region being electrically connected to that one of said rectifying means first and second constant polarity regions opposite that one connected to one of said primary control signal generating means first and second energization regions as aforesaid, and said power conservation means control region being electrically connected to said control signal coupling means in such a manner that no substantially conductive path will occur between said power conservation means first and second terminating regions whenever a signal appears at said control signal coupling means output region capable of permitting said primary control means to provide a relatively low conductivity path between said primary control means first and second terminating regions; and a secondary control signal generating means having first and second energization regions and having an output region, said secondary control signal generating means being capable, upon electrical energization of said secondary control signal generating means first and second energization regions, of providing a signal at said secondary control signal generating means output region indicating occurrence of one or more selected condition in said secondary control signal generating means, said secondary control signal generating means first energization region being electrically connected to said rectifying means first constant polarity region and said secondary control signal generating means second energization region being electrically connected to said rectifying means second constant polarity region, said secondary control signal generating means output region being electrically connected to said signal coupling means in such a manner that the occurrence of a substantially conductive path between said primary control means first and second terminating regions can be ended by said one or more conditions occurring in said secondary control signal generating means.

2. The apparatus of claim 1 wherein said secondary control signal generating means contains a voltage detector circuit capable of both (i) of being operated by, and (ii) of detecting voltages occurring across said secondary control signal generating means first and second energization terminals and being electrically connected to be capable of providing an output signal at said secondary control signal generating means output region indicating when a voltage applied between said secondary control signal generating means first and second energization regions has taken a value less than a selected value.

3. The apparatus of claim 1 wherein said secondary control signal generating means contains an oscillator capable of providing a periodic signal at said secondary control signal generating means output region.

4. The apparatus of claim 1 wherein said control signal coupling means contains a logic gate means, having an output region and at least two input regions including said control signal coupling means first input region and a control signal coupling means second input region, and capable of providing an output region signal response when similar signal values are applied to said input regions, said secondary control signal generating means output region being electrically connected to said control signal coupling means second input region.

5. The apparatus of claim 4 wherein said logic gate means output region is electrically connected to said power conservation means control region.

6. The apparatus of claim 4 wherein said secondary control signal generating means contains a voltage detector circuit capable of both (i) of being operated by, and (ii) of detecting voltages occurring across said secondary control signal generating means first and second energization terminals and being electrically connected to be capable of providing an output signal at said secondary control signal generating means output region indicating when a voltage applied between said secondary control signal generating means first and second energization regions has taken a value less than a selected value.

7. The apparatus of claim 4 wherein said secondary control signal generating means contains an oscillator capable of providing a periodic signal at said secondary control signal generating means output region.

8. The apparatus of claim 1 wherein said primary control means is a first transfer control field-effect device provided in and on a first substrate, said first transfer control field-effect device comprising:
   a first transfer control field-effect device channel region located at least in part in a first selected region of said first substrate;
   first transfer control field-effect device first and second terminating regions serving as said primary control means first and second terminating regions, separated by said first transfer control field-effect device channel region, into which and out of which primary currents through said first field-effect device can, at least in part, pass upon electrical energization of said first transfer control field-effect device first and second terminating regions; and
   a first transfer control field-effect device gate region serving as said primary control means control region and capable of affecting, upon electrical energization thereof, any current flow occurring through said first transfer control field-effect device channel region as a result of electrical energization of said first transfer control field-effect device first and second terminating regions.

9. The apparatus of claim 8 wherein said rectifying means first constant polarity region is electrically common with said first substrate, and wherein said rectifying means contains a first unidirectional current conducting means having therein first and second terminating regions between which an asymmetrical current conducting capability is exhibited, said first unidirectional current conducting means first terminating region serving as said rectifying means second constant polarity region and being electrically connected to said energy storage means second polarity region, and said first unidirectional current conducting means second terminating region serving as said rectifying means first alternating polarity region.

10. The apparatus of claim 9 wherein said control signal coupling means contains a logic gate means, having an output region and at least two input regions including said control signal coupling means first input region and a control signal coupling means second input region, and capable of providing an output region signal response when similar signal values are applied to said input regions, said secondary control signal generating means output region being electrically connected to said control signal coupling means second input region.

11. The apparatus of claim 10 wherein said logic gate means output region is electrically connected to said power conservation means control region.

12. The apparatus of claim 9 wherein said control signal coupling means comprises first and second signal controlled field-effect transistors, each of said first and second signal control field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said rectifying means first constant polarity region, and said second signal controlled field-effect transistor second terminating region being electrically connected to said rectifying means second constant polarity region.

13. The apparatus of claim 12 wherein said control signal coupling means further comprises:
   a third signal controlled field-effect transistor having first and second terminating regions separated by a channel region, and having a gate region;
   a circuit load having first and second terminating regions between which said circuit load is capable of effectively providing a conductive path, said circuit load first terminating region being electrically connected to said first signal controlled field-effect transistor first terminating region, said circuit load second terminating region being electrically connected to both said third signal controlled field-effect transistor first terminating region and to said first signal controlled field-effect transistor gate region; and
   a logic gate means, having an output region and at least two input regions including said control signal coupling means first input region and a control signal coupling means second input region, and capable of providing an output region signal response when similar signal values are applied to said input regions, said logic gate means output region being electrically connected to both said second and third signal controlled field-effect transistor gate regions and being electrically connected to said power conservation means control region, said power conservation means comprising a power conservation field-effect transistor having first and second terminating regions, separated by a channel region, serving as said power conservation means first and second terminating regions and having a gate region serving as said power conservation means control region.

14. The apparatus of claim 13 wherein said control signal coupling means second input region is electrically connected to said secondary control signal generating means output region.

15. The apparatus of claim 9 wherein said rectifying means has a first parasitic bypass means having first and second terminating regions between which said first parasitic bypass means is capable of effectively providing a conductive path, said first parasitic bypass means first terminating region being electrically connected to said rectifying means first alternating polarity region, and said first parasitic bypass means second terminating region being electrically connected to said rectifying means first constant polarity region; and has a second parasitic bypass means having first and second terminating regions between which said second parasitic bypass means is capable of providing a conductive path, said second parasitic bypass means first terminating region being electrically connected to said rectifying means second alternating polarity region, and said second parasitic bypass means second terminating region being electrically connected to said rectifying means first constant polarity region.

16. The apparatus of claim 15 wherein said first parasitic bypass means has a control region therein by which said first parasitic bypass means is capable of being directed to effectively provide said conductive path with said first parasitic bypass means control region being electrically connected to said rectifying means second alternating polarity region, and wherein said second parasitic bypass means has a control region therein by which said second parasitic bypass means is capable of being directed to effectively provide said conductive path with said second parasitic bypass means control region being electrically connected to said rectifying means first alternating polarity region.

17. The apparatus of claim 16 wherein said control signal coupling means comprises first and second signal controlled field-effect transistors, each of said first and second signal control field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said rectifying means first constant polarity region, and said second signal controlled field-effect transistor second terminating region being electrically connected to said rectifying means second constant polarity region.

18. The apparatus of claim 17 wherein said control signal coupling means further comprises:
a third signal controlled field-effect transistor having first and second terminating regions separated by a channel region, and having a gate region;
a circuit load having first and second terminating regions between which said circuit load is capable of effectively providing a conductive path, said circuit load first terminating region being electrically connected to said first signal controlled field-effect transistor first terminating region, said circuit load second terminating region being electrically connected to both said third signal controlled field-effect transistor first terminating region and to said first signal controlled field-effect transistor gate region; and
a logic gate means, having an output region and at least two input regions including said control signal coupling means first input region and a control signal coupling means second input region, and capable of providing an output region signal response when similar signal values are applied to said input regions, said logic gate means output region being electrically connected to both said second and third signal controlled field-effect transistor gate regions and being electrically connected to said power conservation means control region, said power conservation means comprising a power conservation field-effect transistor having first and second terminating regions, separated by a channel region, serving as said power conservation means first and second terminating regions and having a gate region serving as said power conservation means control region.

19. The apparatus of claim 18 wherein said control signal coupling means second input region is electrically connected to said secondary control signal generating means output region.

20. The apparatus of claim 16 wherein said control signal coupling means contains a logic gate means, having an output region and at least two input regions including said control signal coupling means first input region and a control signal coupling means second input region, and capable of providing an output region signal response when similar signal values are applied to said input regions, said secondary control signal generating means output region being electrically connected to said control signal coupling means second input region.

21. The apparatus of claim 20 wherein said logic gate means output region is electrically connected to said power conservation means control region.

22. The apparatus of claim 20 wherein said secondary control signal generating means contains a voltage detector circuit capable of both (i) of being operated by, and (ii) of detecting voltages occurring across said secondary control signal generating means first and second energization terminals and being electrically connected to be capable of providing an output signal at said secondary control signal generating means output region indicating when a voltage applied between said secondary control signal generating means first and second energization regions has taken a value less than a selected value.

23. The apparatus of claim 20 wherein said secondary control signal generating means contains an oscillator capable of providing a periodic signal at said secondary control signal generating means output region.

24. The apparatus of claim 9 wherein a second unidirectional current conducting means is provided having therein first and second terminating regions between which an asymmetrical current conducting capability is exhibited, said second unidirectional current conducting means first terminating region being electrically connected to said first unidirectional current conducting means first terminating region, and said second unidirectional current conducting means second terminating region serving as said rectifying means second alternating polarity region.

25. The apparatus of claim 24 wherein said control signal coupling means contains a logic gate means, having an output region and at least two input regions including said control signal coupling means first input region and a control signal coupling means second input region, and capable of providing an output region signal response when similar signal values are applied to said input regions, said secondary control signal generating means output region being electrically connected to said control signal coupling means second input region.

26. The apparatus of claim 24 wherein said control signal coupling means comprises first and second signal controlled field-effect transistors, each of said first and second signal control field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said rectifying means first constant polarity region, and said second signal controlled field-effect transistor second terminating region being electrically connected to said rectifying means second constant polarity region.

27. The apparatus of claim 26 wherein said control signal coupling means further comprises:
a third signal controlled field-effect transistor having first and second terminating regions separated by a channel region, and having a gate region;
a circuit load having first and second terminating region between which said circuit load is capable of effectively providing a conductive path, said circuit load first terminating region being electrically connected to said first signal controlled field-effect transistor first terminating region, said circuit load second terminating region being electrically connected to both said third signal controlled field-effect transistor first terminating region and to said first signal controlled field-effect transistor gate region; and
a logic gate means, having an output region and at least two input regions including said control signal coupling means first input region and a control signal coupling means second input region, and capable of providing an output region signal response when similar signal values are applied to said input regions, said logic gate means output region being electrically connected to both said second and third signal controlled field-effect transistor gate regions and being electrically connected to said power conservation means control region, said power conservation means comprising a power conservation field-effect transistor having first and second terminating regions, separated by a channel region, serving as said power conservation means first and second terminating regions and having a gate region serving as said power conservation means control region.

28. The apparatus of claim 27 wherein said control signal coupling means second input region is electrically connected to said secondary control signal generating means output region.

29. The apparatus of claim 24 wherein said rectifying means has a first parasitic bypass means having first and second terminating regions between which said first parasitic bypass means is capable of effectively providing a conductive path, said first parasitic bypass means first terminating region being electrically connected to said rectifying means first alternating polarity region, and said first parasitic bypass means second terminating region being electrically connected to said rectifying means first constant polarity region; and has a second parasitic bypass means having first and second terminating regions between which said second parasitic bypass means is capable of providing a conductive path, said second parasitic bypass means first terminating region being electrically connected to said rectifying means second alternating polarity region, and said second parasitic bypass means second terminating region being electrically connected to said rectifying means first constant polarity region.

30. The apparatus of claim 29 wherein said first parasitic bypass means has a control region therein by which said first parasitic bypass means is capable of being directed to effectively provide said conductive path with said first parasitic bypass means control region being electrically connected to said rectifying means second alternating polarity region, and wherein said second parasitic bypass means has a control region therein by which said second parasitic bypass means is capable of being directed to effectively provide said conductive path with said second parasitic bypass means control region being electrically connected to said rectifying means first alternating polarity region.

31. The apparatus of claim 30 wherein said control signal coupling means comprises first and second signal controlled field-effect transistors, each of said first and second signal control field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said rectifying means first constant polarity region, and said second signal controlled field-effect transistor second terminating region being electrically connected to said rectifying means second constant polarity region.

32. The apparatus of claim 31 wherein said control signal coupling means further comprises:
a third signal controlled field-effect transistor having first and second terminating regions separated by a channel region, and having a gate region;
a circuit load having first and second terminating regions between which said circuit load is capable of effectively providing a conductive path, said circuit load first terminating region being electrically connected to said first signal controlled field-effect transistor first terminating region, said circuit load second terminating region being electrically connected to both said third signal controlled field-effect transistor first terminating region and to said first signal controlled field-effect transistor gate region; and
a logic gate means, having an output region and at least two input regions including said control signal coupling means first input region and a control signal coupling means second input region, and capable of providing an output region signal response when similar signal values are applied to said input regions, said logic gate means output region being electrically connected to both said second and third signal controlled field-effect transistor gate regions and being electrically connected to said power conservation means control region, said power conservation means comprising a power conservation field-effect transistor having first and second terminating regions, separated by a channel region, serving as said power conservation means first and second terminating regions and having a gate region serving as said power conservation means control region.

33. The apparatus of claim 32 wherein said control signal coupling means second input region is electrically connected to said secondary control signal generating means output region.

34. The apparatus of claim 30 wherein said control signal coupling means contains a logic gate means, having an output region and at least two input regions including said control signal coupling means first input region and a control signal coupling means second input region, and capable of providing an output region signal response when similar signal values are applied to said input regions, said secondary control signal generating means output region being electrically connected to said control signal coupling means second input region.

35. The apparatus of claim 34 wherein said logic gate means output region is electrically connected to said power conservation means control region.

36. The apparatus of claim 34 wherein said secondary control signal generating means contains a voltage detector circuit capable of both (i) of being operated by, and (ii) of detecting voltages occurring across said secondary control signal generating means first and second energization terminals and being electrically connected to be capable of providing an output signal at said secondary control signal generating means output region indicating when a voltage applied between said secondary control signal generating means first and second energization regions has taken a value less than a selected value.

37. The apparatus of claim 34 wherein said secondary control signal generating means contains an oscillator capable of providing a periodic signal at said secondary control signal generating means output region.

38. An electronic switching circuit for controlling transfer of electrical power from an electrical power supply means to a load means, said switching circuit comprising:

a primary control means having first and second terminating regions and having a control region therein by which said primary control means is capable of being directed to effectively provide a conductive path of a selected conductivity between said primary control means first and second terminating regions, said primary control means first terminating region being electrically connected to a first terminal means adapted for electrical connection to a first circuit portion arrangement which includes both said electrical power supply means and said load means, and said primary control means second terminating region being electrically connected to a second terminal means adapted for electrical connection to said first circuit portion arrangement;

a rectifying means having first and second alternating polarity regions and having first and second constant polarity regions such that said rectifying means is capable of providing a constant polarity voltage between said first and second constant polarity regions if supplied with an alternating polarity voltage between said first and second alternating polarity regions, said first alternating polarity region being electrically connected to said first terminal means and said second alternating polarity region being electrically connected to said second terminal means;

an energy storage means having first and second polarity regions between which said energy storage means is capable of providing electrical energy storage, said energy storage means first polarity region being electrically connected to said first rectifying means first constant polarity region and said energy storage means second polarity region being electrically connected to said rectifying means second constant polarity region;

a primary control signal generating means having first and second energization regions and an output region, said primary control signal generating means being capable, upon electrical energization of said primary control signal generating means first and second energization regions, of providing a signal at said primary control signal generating means output region indicating occurrence of one or more selected conditions in said primary control signal generating means, there being one of said primary control signal generating means first and second energization regions electrically connected to one of said rectifying means first and second constant polarity regions;

a control signal coupling means having at least a first input region and a first output region, and which permits, at least selectively, communication to said control signal coupling means first output region concerning signals occurring at said control signal coupling means first input region, said first control signal coupling means first input region being electrically connected to said primary control signal generating means output region and said control signal coupling means output region being electrically connected to said primary control means control region;

a power conservation means having first and second terminating regions and having a control region therein by which said power conservation means is capable of being directed to effectively provide a conductive path of a selected conductivity between said power conservation means first and second terminating regions, said power conservation means first terminating region being electrically connected to that one of said primary control signal generating means first and second energization regions opposite that one connected to one of said rectifying means first and second constant polarity regions as aforesaid, said power conservation means second terminating region being electrically connected to that one of said rectifying means first and second constant polarity regions opposite that one connected to one of said primary control signal generating means first and second energization regions as aforesaid, and said power conservation means control region being electrically connected to said control signal coupling means in such a manner that no substantially conductive path will occur between said power conservation means first and second terminating regions whenever a signal appears at said control signal coupling means output region capable of permitting said primary control means to provide a relatively low conductivity path between said primary control means first and second terminating regions; and a secondary control signal generating means having first and second energization regions and having an output region, said secondary control signal generating means being capable, upon electrical energization of said secondary control signal generating means first and second energization regions, of providing a signal at said secondary control signal generating means output region indicating occurrence of one or more selected condition in said secondary control signal generating means, said secondary control signal generating means first energization region being electrically connected to said rectifying means first constant polarity region and said secondary control signal generating means second energization region being electrically connected to said rectifying means second constant polarity region, said secondary control signal generating means output region being electrically connected to said signal coupling means in such a manner that the occurrence of a substantially conductive path between said primary control means first and second terminating regions can be ended by said one or more conditions occurring in said secondary control signal generating means.

39. The apparatus of claim 38 wherein said electrical power supply means is a selected one of a constant polarity electrical power supply means and an alternating electrical power supply means.

40. The apparatus of claim 39 wherein said primary control means is a first transfer control field-effect device provided in and on a first substrate, said first transfer control field-effect device comprising:
a first transfer control field-effect device channel region located at least in part in a first selected region of said first substrate;
first transfer control field-effect device first and second terminating regions serving as said primary control means first and second terminating regions, separated by said first transfer control field-effect device channel region, into which and out of which primary currents through said first field-effect device can, at least in part, pass upon electrical energization of said first transfer control field-effect device first and second terminating regions; and
a first transfer control field-effect device gate region serving as said primary control means control region and capable of affecting, upon electrical energization thereof, any current flow occurring through said first transfer control field-effect device channel region as a result of electrical energization of said first transfer control field-effect device first and second terminating regions.

41. The apparatus of claim 39 wherein said control signal coupling means contains a logic gate means, having an output region and at least two input regions including said control signal coupling means first input region and a control signal coupling means second input region, and capable of providing an output region signal response when similar signal values are applied to said input regions, said secondary control signal generating means output region being electrically connected to said control signal coupling means second input region.

42. The apparatus of claim 39 wherein said secondary control signal generating means contains a voltage detector circuit capable of both (i) of being operated by, and (ii) of detecting voltages occurring across said secondary control signal generating means first and second energization terminals and being electrically connected to be capable of providing an output signal at said secondary control signal generating means output region indicating when a voltage applied between said secondary control signal generating means first and second energization regions has taken a value less than a selected value.

43. The apparatus of claim 39 wherein said secondary control signal generating means contains an oscillator capable of providing a periodic signal at said secondary control signal generating means output region.

44. The apparatus of claim 40 wherein said rectifying means first constant polarity region is electrically common with said first substrate, and wherein said rectifying means contains a first unidirectional current conducting means having therein first and second terminating regions between which an asymmetrical current conducting capability is exhibited, said first unidirectional current conducting means first terminating region serving as said rectifying means second constant polarity region and being electrically connected to said energy storage means second polarity region, and said first unidirectional current conducting means second terminating region serving as said rectifying means first alternating polarity region.

45. The apparatus of claim 41 wherein said logic gate means output region is electrically connected to said power conservation means control region.

46. The apparatus of claim 41 wherein said secondary control signal generating means contains a voltage detector circuit capable of both (i) of being operated by, and (ii) of detecting voltages occurring across said secondary control signal generating means first and second energization terminals and being electrically connected to be capable of providing an output signal at said secondary control signal generating means output region indicating when a voltage applied between said secondary control signal generating means first and second energization regions has taken a value less than a selected value.

47. The apparatus of claim 41 wherein said secondary control signal generating means contains an oscillator capable of providing a periodic signal at said secondary control signal generating means output region.

48. An electronic switching circuit for controlling transfer of electrical power from an electrical power supply means to a load means, said switching circuit comprising:
a first transfer control field-effect device provided in and on a first substrate, said first transfer control field-effect device comprising:
a first transfer control field-effect device channel region located at least in part in a first selected region of said first substrate;
a first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes both said electrical power supply means and said load means, and said first field-effect device second terminating region being electrically connected to a second terminal means adapted for electrical connection to said first circuit portion arrangement; and a first transfer control field-affect device gate region capable of affecting upon electrical energization thereof, any current flow occurring through said first transfer control field-effect device channel region as a result of electrical energization of said first transfer control field-effect device first and second terminating regions;

an energy storage means having first and second polarity regions between which said energy storage means is capable of providing electrical energy storage, said energy storage means first polarity region being electrically connected to said first substrate;

an electrical coupling means having first and second connecting regions between which said electrical coupling means is capable of providing an electrically conductive path in at least one direction, said electrical coupling means first connecting region being electrically connected to said energy storage means second polarity region, and said electrical coupling means second connecting region being electrically connected to one of said first and second terminal means;

a primary control signal generating means having first and second energization regions and an output region, said primary control signal generating means being capable, upon electrical energization of said primary control signal generating means first and second energization regions, of providing a signal at said primary control signal generating means output region indicating occurrence of one or more selective conditions in said primary control signal generating means, there being one of said primary control signal generating means first and second energization regions electrically connected to one of said energy storage means first and second polarity regions;

a control signal coupling means having at least a first input region and a first output region, and which permits, at least selectively, communication to said control signal coupling means first output region concerning signals occurring at said control signal coupling means first input region, said first control signal coupling means first input region being electrically connected to said primary control signal generating means output region and said control signal coupling means output region being electrically connected to said first transfer control field-effect device gate region;

a power conservation means having first and second terminating regions and having a control region therein by which said power conservation means is capable of being directed to effectively provide a conductive path of a selected conductivity between said power conservation means first and second terminating regions, said power conservation means first terminating region being electrically connected to that one of said primary control signal generating means first and second energization regions opposite that one connected to one of said energy storage means first and second polarity regions as aforesaid, said power conservation means second terminating region being electrically connected to that one of said energy storage means first and second polarity regions opposite that one connected to one of said primary control signal generating means first and second energization regions as aforesaid, said power conservation means control region being electrically connected to said control signal coupling means in such a manner that no substantially conductive path will occur between said power conservation means first and second terminating regions whenever a signal appears at said control signal coupling means output region capable of permitting said primary control means to provide a relatively low conductivity path between said primary control means first and second terminating regions; and a secondary control signal generating means having first and second energization regions and having an output region, said secondary control signal generating means being capable, upon electrical energization of said secondary control signal generating means first and second energization regions, of providing a signal at said secondary control signal generating means output region indicating occurrence of one or more of selected conditions in said secondary control signal generating means, said secondary control signal generating means first energization region being electrically connected to said energy storage means first polarity region and said secondary control signal means second energization region being electrically connected to said energy storage means second polarity region, said secondary control signal generating means output region being electrically connected to said signal coupling means in such a manner that the occurrence of a substantially conductive path between said primary control means first and second terminating regions can be ended by said one or more conditions occurring in said secondary control signal generating means.

49. The apparatus of claim 48 wherein said electrical power supply means is a selected one of a constant polarity electrical power supply means and an alternating polarity electrical power supply means.

50. The apparatus of claim 48 wherein said electrical coupling means is a diode means.

51. The apparatus of claim 48 wherein said electrical coupling means is a direct electrical connection and said electrical power supply means is a constant polarity electrical power supply means.

52. The apparatus of claim 49 wherein said control signal coupling means contains a logic gate means, having an output region and at least two input regions including said control signal coupling means first input region and a control signal coupling means second input region, and capable of providing an output region signal response when similar signal values are applied to said input regions, said secondary control signal generating means output region being electrically connected to said control signal coupling means second input region.

53. The apparatus of claim 49 wherein said secondary control signal generating means contains a voltage detector circuit capable of both (i) of being operated by, and (ii) of detecting voltages occurring across said secondary control signal generating means first and second energization terminals and being electrically connected to be capable of providing an output signal at said secondary control signal generating means output region indicating when a voltage applied between said secondary control signal generating means first and second energization regions has taken a value less than a selected value.

54. The apparatus of claim 49 wherein said secondary control signal generating means contains an oscillator capable of providing a periodic signal at said secondary control signal generating means output region.

55. The apparatus of claim 52 wherein said logic gate means output region is electrically connected to said power conservation means control region.

56. The apparatus of claim 52 wherein said secondary control signal generating means contains a voltage detector circuit capable of both (i) of being operated by, and (ii) of detecting voltages occurring across said secondary control signal generating means first and second energization terminals and being electrically connected to be capable of providing an output signal at said secondary control signal generating means output region indicating when a voltage applied between said secondary control signal generating means first and second energization regions has taken a value less than a selected value.

57. The apparatus of claim 52 wherein said secondary control signal generating means contains an oscillator capable of providing a periodic signal at said secondary control signal generating means output region.

* * * * *